United States Patent [19]

El-Ayat

[11] Patent Number: 5,107,146
[45] Date of Patent: Apr. 21, 1992

[54] MIXED MODE ANALOG/DIGITAL PROGRAMMABLE INTERCONNECT ARCHITECTURE

[75] Inventor: Khaled A. El-Ayat, Cupertino, Calif.
[73] Assignee: Actel Corporation, Sunnyvale, Calif.
[21] Appl. No.: 654,966
[22] Filed: Feb. 13, 1991
[51] Int. Cl.$^5$ .......................................... H03K 19/177
[52] U.S. Cl. ..................................... 307/465; 341/110; 364/600
[58] Field of Search ................. 341/110, 126; 364/600; 307/465–469

[56] References Cited

U.S. PATENT DOCUMENTS

| | | | |
|---|---|---|---|
| 4,225,940 | 9/1980 | Moriyasu et al. | 341/110 X |
| 4,318,080 | 2/1982 | Yoshida | 341/126 X |
| 4,355,304 | 10/1982 | Kasuga et al. | 341/110 X |
| 4,758,985 | 7/1988 | Carter | 307/465 X |
| 4,807,168 | 2/1989 | Moopenn et al. | 364/600 X |
| 4,860,012 | 8/1989 | Rich et al. | 341/126 X |
| 4,910,417 | 3/1990 | El Gamal et al. | 307/465 |

FOREIGN PATENT DOCUMENTS 0112639  8/1980  Japan .................................. 364/600

OTHER PUBLICATIONS

"Hybrid Computer Meets Demands of Large Scale Multitasking Applications", *Computer Design*, vol. 7, No. 6, Jun. 1978, pp. 50, 55.

Primary Examiner—David Hudspeth
Attorney, Agent, or Firm—Kenneth D'Alessandro

[57] ABSTRACT

A user-programmable integrated circuit includes an analog portion containing user-configurable analog circuit modules, a digital portion containing user-configurable digital circuit modules, an interface portion containing user-configurable interface circuits for conversion of signals from analog to digital form and from digital to analog form, and a user-configurable interconnection and input/output architecture.

2 Claims, 6 Drawing Sheets

MIXED MODE ANALOG/DIGITAL PROGRAMMABLE INTERCONNECT ARCHITECTURE

BACKGROUND OF THE INVENTION

1. Field Of The Invention

The present invention relates to user-configurable integrated circuits. More particularly, the present invention relates to user-configurable circuit arrays including both analog and digital circuit elements.

2. The Prior Art

User-configurable digital integrated circuits are known in the art.

BRIEF DESCRIPTION OF THE INVENTION

The present invention is a user-programmable integrated circuit including an analog portion containing user-configurable analog circuit modules, a digital portion containing user-configurable digital circuit modules, an interface portion containing user-configurable interface circuits for conversion of signals from analog to digital form and from digital to analog form, and a user-configurable interconnection and input/output architecture.

The analog portion of the integrated circuit according to the present invention may include both analog input and output circuits Analog input circuits included within the scope of array circuitry of the present invention include, but are not limited to, circuit elements such as amplifiers, preamplifiers, filters, analog-to-digital (A/D) converters. Analog output circuits within the scope of the present invention include, but are not limited to, amplifiers, filters, digital-to-analog (D/A) converters and other circuits. Other analog circuits are included within the scope of the present invention. For example analog comparators, analog switches, and analog multiplexers may be used in circuit configurations according to the present invention. The particular type of analog circuits used with the present invention will depend to a large extent on the particular application to which the circuit is to be put, and those of ordinary skill in the art will readily recognize the applicability of the principles of the present invention to particular circuit design considerations.

According to the present invention, the parameters of the analog circuitry in the analog section of the integrated circuit, such as amplifier gain, filter bandwidth, A/D and D/A conversion resolution, and other parameters may be user-selectable by means of user-programmable means such as antifuses, fusible links, non-volatile memory elements, pass transistors, memory-element-controlled switches or the like. The fabrication and use of such user-programmable elements are well known in the art.

According to a presently preferred embodiment of the invention, tuning of analog electrical parameters includes use of such user-programmable technologies for partial or complete selection of resistive, capacitive, passive, or active circuit elements, to attain the required circuit performance. For example, the gain of an operation amplifier may be selected or tuned by appropriate selection or alteration of input or feedback resistor values.

The digital portion of an integrated circuit according to the present invention includes user-configurable logic function circuits imbedded in a user-configurable interconnect architecture, such as are disclosed and claimed in U.S. Pat. No. 4,758,745, U.S. Pat. No. 4,873,459, and U.S. Pat. No. 4,910,417, expressly incorporated herein by reference for the architecture and user-configurable circuit modules disclosed therein.

The analog and digital circuits included in the present invention may be connected together using interface circuit known in the art, such as A/D and D/A converters, integrated onto the same semiconductor substrate material as the digital and analog circuitry.

According to the present invention, all analog signal processing may be performed by analog circuits included on the integrated circuit array. The analog signals may then be converted to digital form and then may be digitally processed using the digital portion of the integrated circuit. If necessary, digital signals may be converted to analog form and output from the integrated circuit at analog voltage levels.

According to a presently preferred embodiment of the invention, input and output signals are in analog or digital form as required by the circuit application.

In a presently preferred embodiment of the invention, a programmable interconnect architecture including a plurality of user-configurable analog switches may be used to provide interconnections between elements in the analog portions of the circuit and connections from circuit elements in the analog portion to the analog to digital interface section. In addition, user-configurable analog switches are also used to establish interconnections between the input/output pads of the integrated circuit and the analog circuit block.

User-configurable interconnect elements are used to make interconnections throughout the digital portions of the circuit and from the digital portion to the digital to analog interface portion of the circuit. The user-configurable interconnect architecture may also be used to connect circuit nodes from the digital portion of the integrated circuit to input and output pins of the integrated circuit.

According to yet another aspect of the present invention, both analog and digital probe circuitry allows monitoring and observing of the signal conditions at internal nodes in the analog and digital portions of the integrated circuit.

BRIEF DESCRIPTION OF THE DRAWINGS

FIG. 2b is a schematic diagram of a presently preferred embodiment of the analog switch in FIG. 2a.

DETAILED DESCRIPTION OF A PREFERRED EMBODIMENT

Figure 1:
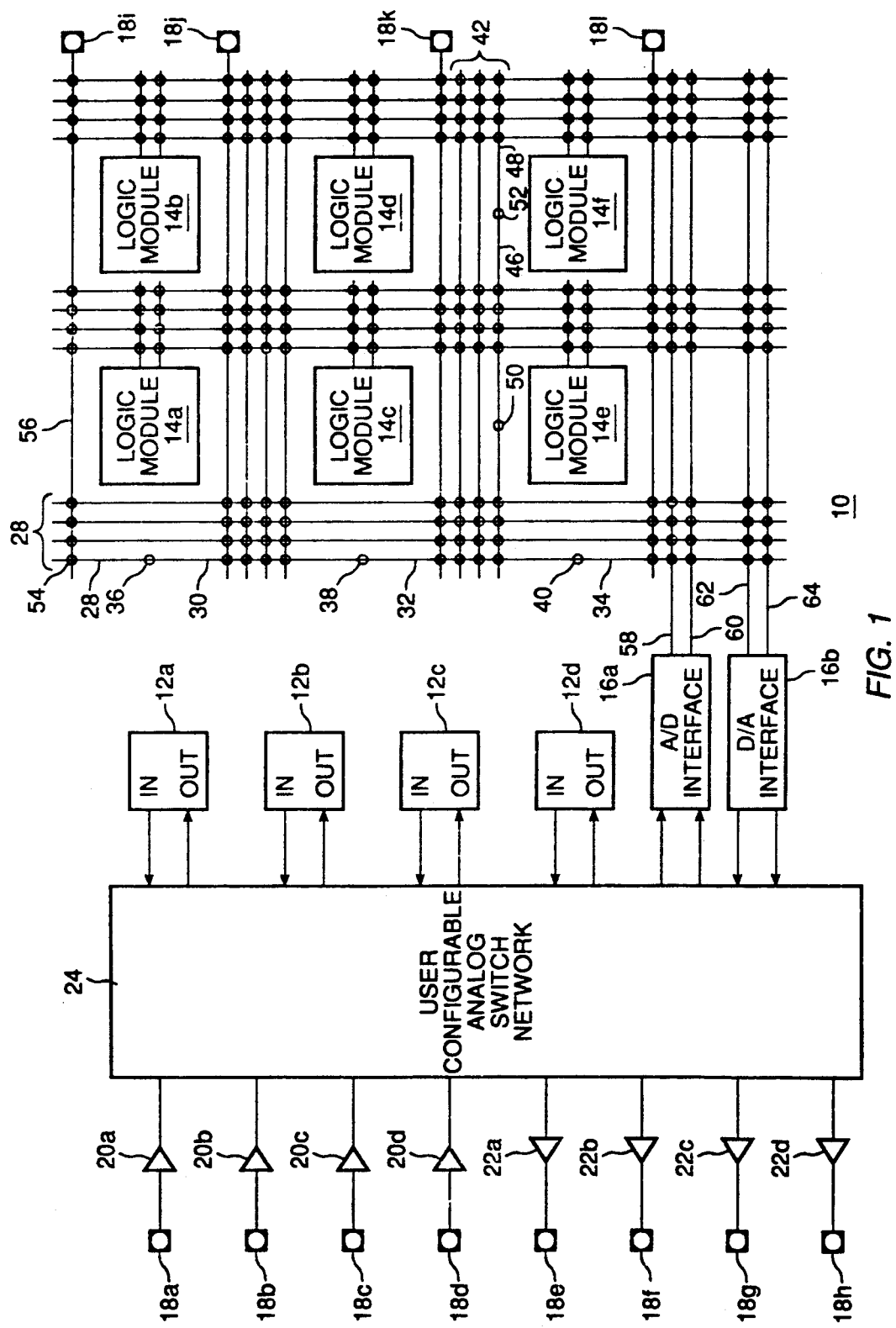
FIG. 1 is a block diagram of an integrated circuit architecture according to the present invention.

Referring first to FIG. 1, an illustrative embodiment of a mixed Analog/Digital user-programmable integrated circuit array 10 according to the present invention is shown. Array 10 includes a plurality of analog circuit modules, illustrated at blocks 12a, 12b, 12c, and 12d. Analog circuit modules 12a-12d may include amplifiers, preamplifiers, filters, analog switches, multiplexers, and the like. The decision regarding which types and quantities of each type of analog circuit modules to include in a particular integrated circuit according to the present invention will be a matter of design choice based largely upon the contemplated uses of the circuit.

Array 10 also includes a plurality of digital circuit modules, illustrated at reference numerals 14a, 14b, 14c, 14d, 14e, and 14f. In a presently preferred embodiment, digital circuit modules 14a-14f may be user-configurable digital logic circuits, such as those disclosed in U.S. Pat. No. 4,914,417, or in co-pending application, Ser. No. 07/522,232, filed May 11, 1990, and assigned to the same assignee as the present invention.

Array 10 also includes a plurality of analog-to-digital and digital-to-analog interface circuits, illustrated at blocks 16a and 16b, respectively. Typical examples of such circuits are well-known analog-to-digital converters and digital-to-analog converters. The speed and resolution of such circuits is also a matter of design choice and will be dictated by the applications to which the integrated circuits will be put.

A plurality of input/output pads, illustrated at reference numerals 18a-18l, are provided on the integrated circuit containing array 10 for the purpose of transferring analog and/or digital signals and programming information to and from the integrated circuit, and for providing power supply voltages, etc. The number of input/output pins will be dictated by circuit density and other well-understood factors.

In the example shown in FIG. 1, input/output pads 18a-18d are used for analog input signals and communicate with the integrated circuit through input buffers 20a-20d, input/output pads 18e-18h are used for analog output signals and communicate with the integrated circuit through output buffers 22a-22d, and input/output pads 18i-18l are used for inputs and outputs of digital signals.

Interconnections between the various analog circuit modules and input/output pins 18a-18h and to and from the analog sides of analog to digital interface circuit 16a and digital to analog interface circuit 16b are made using a user-configurable analog switch network 24. User-configurable analog switch network 24 contains a plurality of configurable analog switches, connected between selected circuit nodes in the analog portion of array 10 and which may be programmed by the user to be on or off. The number and type of possible connections will vary for particular embodiments of the present invention and the degree of connectability provided by such a network in an actual integrated circuit fabricated according to the principles of the present invention will be dictated by particular design considerations.

The connections between digital logic modules 14a-14f, between those modules and interface circuits 16a and 16b and input/output pads 18i-18l on the integrated circuit containing the array 10 of the present invention may be made using a user-programmable interconnect architecture. This architecture is illustrated in FIG. 1 as a network of conductors running in channels disposed in rows and columns in the area of the integrated circuit adjacent to the digital and interface circuit modules in array 10.

As is shown in FIG. 1 some conductors in the interconnect matrix are shown divided along their length into one or more segments. These segments are joined together by programmable interconnect elements illustrated symbolically by circles. By way of example, the leftmost conductor in a vertical channel 26 is shown divided into segments 28, 30, 32, and 34 by programmable interconnect elements 36, 38, and 40. Similarly, the bottom conductor in horizontal channel 42 is shown divided into segments 44, 46, and 48 by programmable interconnect elements 50 and 52.

Programmable interconnect elements are also shown symbolically as circles disposed at crosspoints between intersecting ones of the conductors. For example, a programmable interconnect element identified by reference numeral 54 is shown at the crosspoint between segment 28 and conductor 56 connected to input output pad 18i.

The number of conductors in each channel, the segmentation of the conductors, and the number of programmable interconnect elements placed at crosspoints in the interconnect architecture may all be varied according to the size and layout of array 10. Various schemes for such an interconnect architecture are shown in U.S. Pat. No. 4,758,745, U.S. Pat. No. 4,873,459, U.S. Pat. No. 4,910,417, and co-pending application Ser. No. 07/542,722, filed Jun. 22, 1990, expressly incorporated herein by reference.

The programmable interconnect elements themselves may be antifuses, transistors controlled by registers or other memory elements, fusible links, or the like. In a presently preferred embodiment, antifuses are utilized.

Those of ordinary skill in the art will recognize that FIG. 1 has been drawn somewhat schematically for simplicity. Such persons will readily recognize that some of the interconnect conductors shown in FIG. 1 are in reality comprised of a plurality of conductors. For example, conductors 58, 60, 62, and 64, connecting the interface modules 16a and 16b to the digital interconnection architecture, are multiconductor busses. The number of individual conductors contained in each of these busses will, of course, depend on the resolution of the A/D and D/A converters used in a particular circuit fabricated according to the principles of the present invention.

Numerous programmable analog circuits may be incorporated into the analog portion of the array of the present invention. Selection of user-selectable parameters for the analog circuit modules as well as interconnection of the analog circuit modules into the array of the present invention may be facilitated using a user-programmable analog switch. Such a user-programmable analog switch 70 is shown in block diagram form in FIG. 2a and includes an analog input node 72, an analog output node 74 and a control voltage input 76. A user-programmable interconnect element 78 is connected between control voltage input 76 and ground.

User-programmable analog switch 70 is configured to connect its analog input node 72 to its analog output node 74 and thus pass the analog signal appearing from analog input node 72 to analog output node 74 when its control voltage input 76 is in a first logic state and to disconnect its analog input node 72 from its analog output node 74 when its control voltage input 76 is in a second logic state. The logic state appearing on control voltage input 76 of user-programmable analog switch 70 may be determined by either programming programmable interconnect element 78 or leaving it unprogrammed to connect it to ground or leave it ungrounded.

Figure 2A:
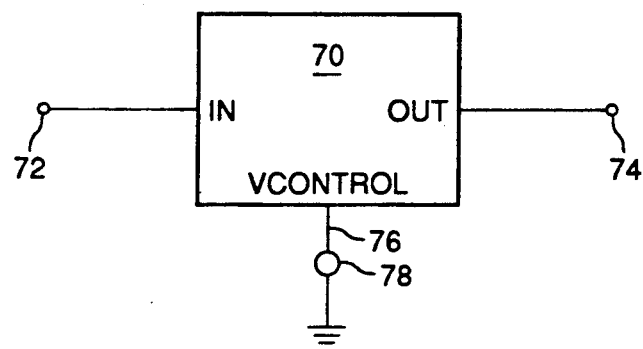
FIG. 2a is a block diagram of a programmable analog switch suitable for use in the present invention.
Figure 2B:
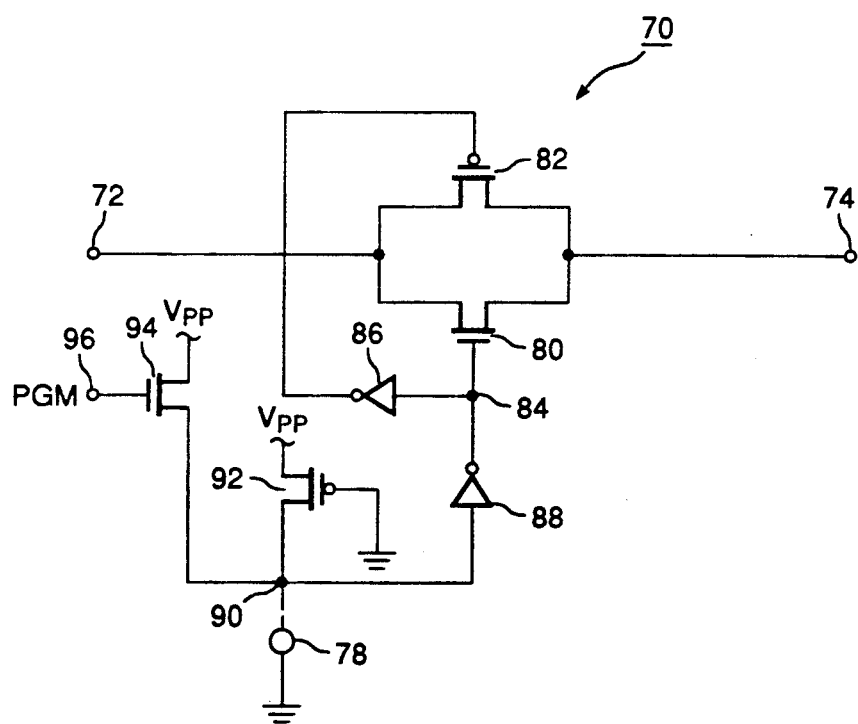

Referring now to FIG. 2b, a presently preferred embodiment of a user-programmable analog switch 70 according to the invention is shown. From an examination of FIG. 2b, it may be seen that user-programmable analog switch 70 includes an analog pass gate comprising N-channel MOS transistor 80 and P-channel MOS transistor 82. The pass gate is driven from a circuit node 84. Inverter 86 assures that the signals on the gates of transistors 80 and 82 are complementary, so that both transistors are either on or off simultaneously.

Circuit node 84 is driven by an inverter 88 driven by a circuit node 90. Circuit node 90 is disposed between a user-programmable interconnect element 78, having its other end connected to ground, and a P-channel transistor 92 connected as a current source from $V_{DD}$. If user-programmable interconnect element conducts, node 90 is connected to ground. If user-programmable interconnect element does not conduct, node 90 is maintained at a logic high voltage by the action of the current source P-channel MOS transistor 92.

In an embodiment of the present invention where user-programmable interconnect element 78 is an antifuse, it may be programmed easily by providing a programming transistor 94, connected to a source of programming voltage $V_{PP}$. Programming transistor 94 has its gate connected to a programming node 96. If programming node 96 is raised to $V_{PP}$, the antifuse user-programmable interconnect element will be programmed.

Figure 3A:
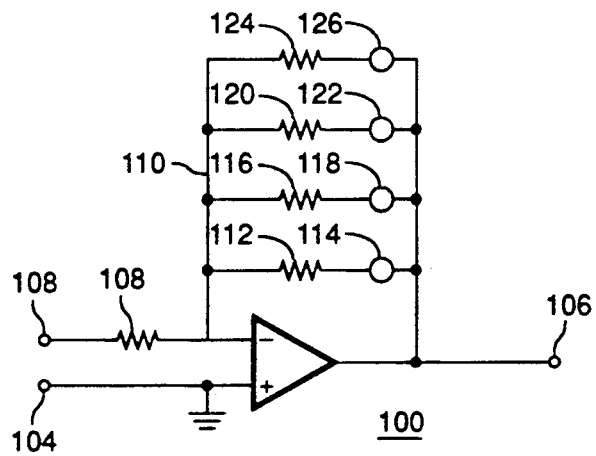
FIG. 3a is a schematic diagram of an operational amplifier having programmable gain which may be incorporated into the analog portion of the present invention.

Referring now to FIG. 3a, a schematic diagram is shown of an operational amplifier having user-programmable gain which may be incorporated into the analog portion of the present invention. Operational amplifier 100, which may be any operational amplifier circuit as is known in the art, is seen to include inverting input node 110, non-inverting input 104, and output 106. A first resistor 108 is connected in series between inverting input 102 and inverting input node 110 of amplifier 100. Non-inverting input 104 is connected to ground.

According to the present invention, a plurality of resistors and user-programmable interconnect elements are utilized to set the gain of operational amplifier 100. Thus, resistor 112 is placed in series with user-programmable interconnect element 114 between output node 106 and inverting input node 110 of amplifier 100. Similarly, resistor 116 is placed in series with user-programmable interconnect element 118 between output node 106 and inverting input node 110 of amplifier 100, resistor 120 is placed in series with user-programmable interconnect element 122 between output node 106 and inverting input node 110 of amplifier 100, and resistor 124 is placed in series with user-programmable interconnect element 126 between output node 106 and inverting input node 110 of amplifier 100.

Those of ordinary skill in the art will recognize that, depending on the values chosen for the resistors, and how many resistor and user-programmable interconnect element combinations are provided, the gain of amplifier 100 may be set to one of a number of different values by appropriately programming selected ones of the user-programmable interconnect elements.

The circuit of FIG. 3a can provide selectable gain for amplifier 100 with an accuracy limited by the predictability of the final resistance of the user-programmable interconnect elements 114, 118, 122, and 126. In many applications, a larger degree of accuracy is needed than can be assured by using the circuit of FIG. 3a.

Figure 3B:
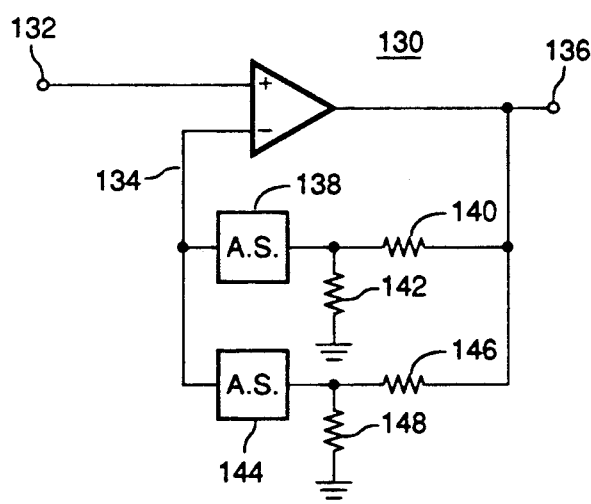
FIG. 3b is a schematic diagram of an operational amplifier having programmable gain without switch-induced error which may be incorporated into the analog portion of the present invention.

Referring now to FIG. 3b, a schematic diagram of an amplifier is shown having programmable gain without switch-induced error which may be incorporated into the analog portion of the present invention. Amplifier 130 is shown having non-inverting input node 132, inverting input node 134, and output node 136. A first feedback network comprising analog switch 138 and resistors 140 and 142 is connected between inverting input node 134 and output node 136. A second feedback network similar to the first feedback network and comprising analog switch 144 and resistors 146 and 148 is also connected between inverting input node 134 and output node 136. In a presently preferred embodiment of the invention, analog switches 138 and 144 may be the analog switches disclosed with respect to FIGS. 2a and 2b. Using the well known relationship for amplifier gain it may be seen that if first analog switch 138 is programmed, the gain of the circuit is:

$$A = 1 + \frac{R_{140}}{R_{142}} \quad (1)$$

and if second analog switch 144 is programmed, the gain of the circuit is:

$$A = 1 + \frac{R_{146}}{R_{148}} \quad (2)$$

By using the analog switch circuits of FIGS. 2a and 2b, the gain of the amplifier is not subject to switch-induced gain error.

Figure 3C:
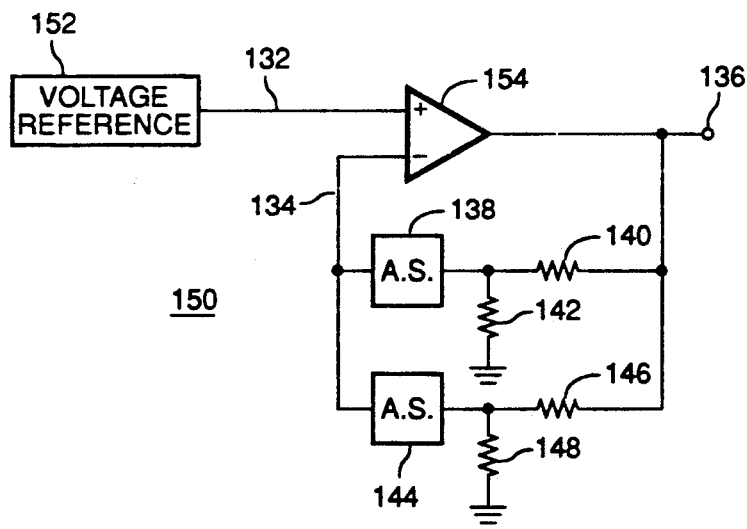
FIG. 3c is a schematic diagram of a programmable voltage reference source without switch-induced error which may be incorporated into the analog portion of the present invention.

Using the principles of the present invention, other analog circuits having user-selectable parameters may be configured and used in an array as disclosed herein. Referring now to FIG. 3c, a programmable voltage reference source 150 includes a voltage reference 152, which may be, for example, a bandgap voltage reference circuit. The output of voltage reference 152 is connected to the input of an amplifier 154, which may be an amplifier of the type disclosed with reference to FIG. 3b (the same reference numerals are used for like elements in FIGS. 3b and 3c).

Those of ordinary skill in the art will appreciate that the circuit of FIG. 3c can be configured by a user to provide one of a plurality of reference voltages. The number and discrete values of available reference voltages will depend upon the number of feedback networks and the resistance values used in them.

Figure 3D:
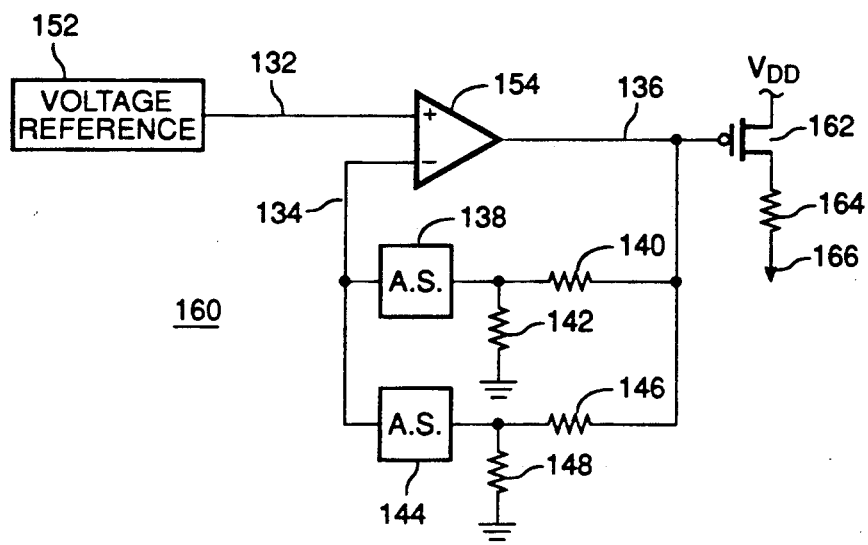
FIG. 3d is a schematic diagram of a programmable precision current reference source which may be incorporated into the analog portion of the present invention.

The circuits of FIGS. 3b and 3c can be combined to configure a precision current reference if an additional MOS transistor and resistor are included. Referring now to FIG. 3d, a precision current reference circuit 160 is shown to include all of the elements of the programmable voltage reference circuit of FIG. 3c. In addition, a P-channel MOS current source transistor 162 has its gate connected to the output node 136 of amplifier 154. The source of P-channel MOS current source transistor 162 is connected to a voltage supply $V_{DD}$ and its drain is connected to resistor 164. The other end of resistor 164 is the output node 166 of the precision current reference circuit 160.

Figure 3E:
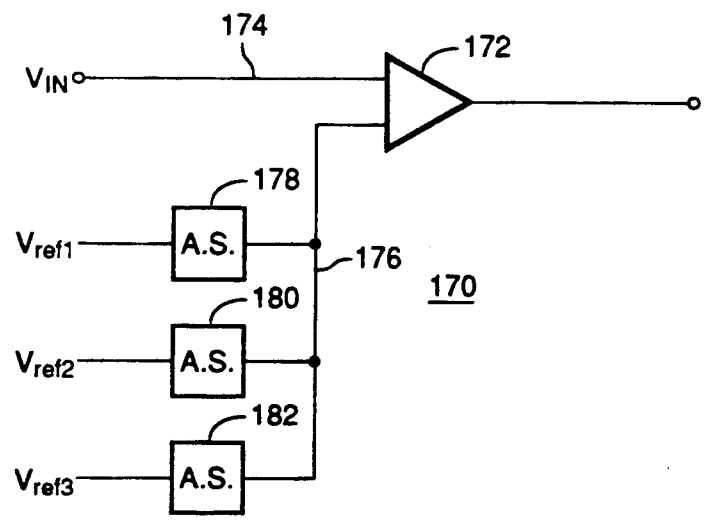
FIG. 3e is a schematic diagram of a programmable voltage comparator which may be incorporated into the analog portion of the present invention.

Another user-configurable analog circuit according to the present invention is shown in FIG. 3e. Referring now to FIG. 3e a schematic diagram of a programmable analog voltage comparator 170 is shown. User-configurable analog voltage comparator 170 includes a comparator 172 as is known in the art. The analog voltage input is placed on one input to comparator 172 at node 174. The other input node 176 of comparator 172 is connected to the outputs of a plurality of analog switches shown at reference numerals 178, 180, and 182. The inputs of analog switches 178, 180, and 182 are connected to sources of first, second, and third reference voltages $V_{ref1}$, $V_{ref2}$, and $V_{ref3}$.

Figure 3F:
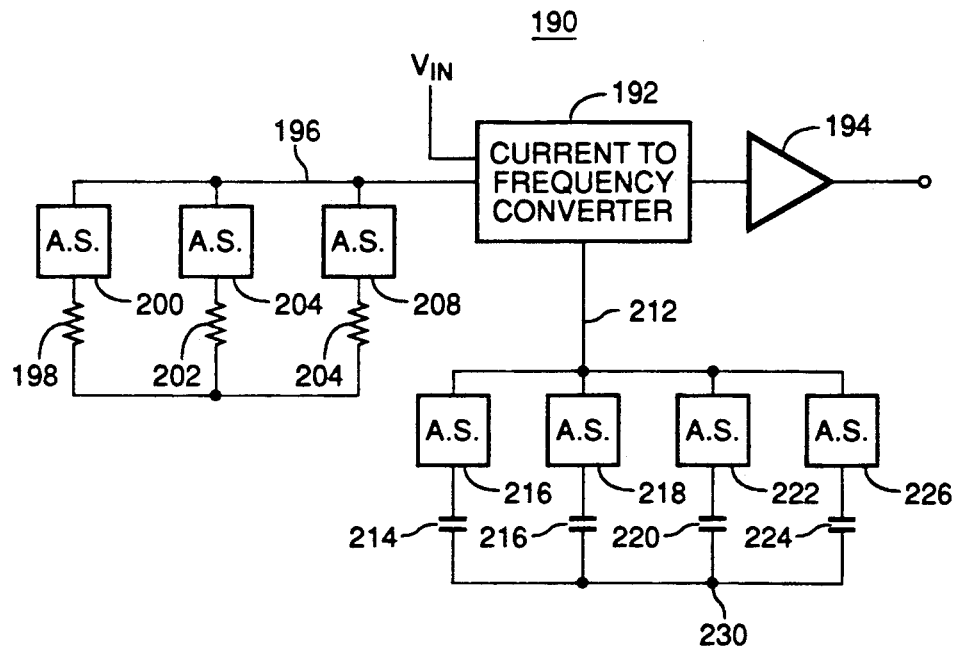
FIG. 3f is a schematic diagram of a programmable voltage-controlled oscillator which may be incorporated into the analog portion of the present invention.

FIG. 3f is a schematic diagram of a programmable voltage-controlled oscillator (VCO) circuit 190 without switch-induced error which may be incorporated into the analog portion of the present invention. VCO 190 includes current-to frequency converter 192 driving buffer amplifier 194. Those of ordinary skill in the art will recognize that numerous circuits are available for performing this function, and that selection of a particular circuit is merely a matter of design choice. Generally, such current-to-frequency converter circuits include one or more nodes to which capacitors and resistors are connected. The capacitance and resistance values are chosen to select the frequency at which the oscillator circuit is to operate.

In the illustrative circuit example of FIG. 3f, a first circuit node 196 associated with current-to-frequency converter 192 is for connection to an external resistance. First resistor 198 is connected to first circuit node 196 through a first analog switch 200. Similarly, second resistor 200 is connected to first circuit node 196 through a second analog switch 202, and third resistor 204 is connected to first circuit node 196 through a third analog switch 206. The other ends of resistors 198, 202, and 206 are connected to a circuit node 210 tied to a voltage or current source the details of which depend upon the particular design of current-to-frequency converter 192.

In like fashion, a second circuit node 196 associated with current-to-frequency converter 192 is for connection to an external capacitance. First capacitor 214 is connected to second circuit node 212 through a first analog switch 214. Similarly, second capacitor 216 is connected to second circuit node 212 through a second analog switch 218, third capacitor 220 is connected to second circuit node 212 through a third analog switch 222, and fourth capacitor 224 is connected to second circuit node 212 through a fourth analog switch 226.

As with the other user-selectable parameters disclosed in FIGS. 3b-3e, the choice of frequency for VCO 190 is made by connecting a selected combination of resistors 198, 202, and 206 and capacitors 214, 216, 220, and 224 to current-to-frequency converter 192. The example of FIG. 3f, like the examples in FIGS. 3a-3e, is illustrative only, and those of ordinary skill in the art will realize that the number of user-configurable component choices designed into a particular integrated circuit fabricated according to the present invention is simply a matter of design choice.

Figure 4:
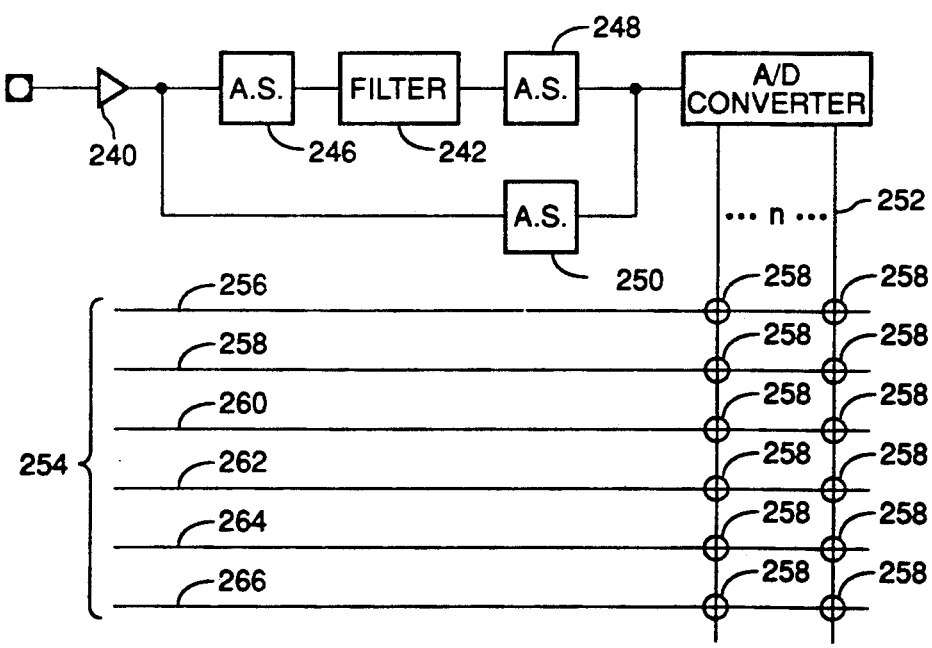
FIG. 4 is a schematic diagram showing an example of connectability provided between the analog circuit modules input/output pads and interface circuits of the present invention.

Referring now to FIG. 4, a schematic diagram is provided which illustrates an example of connectability provided between the analog circuit modules input/output pads and interface circuits of the present invention. The analog section shown in FIG. 4a includes an analog preamplifier 240, a filter 242, and an analog-to-digital converter 244. The preamplifier 240 and the filter 242 may include tunable electrical performance parameters such as gain and filter coefficient that are user-programmable as disclosed herein. The analog section also contains programmable analog switches 246, 248, and 250 that allow a particular block to be included or removed from the circuit path. For example, if filter 242 is to be included in the circuit, switches 246 and 248 are turned on and analog switch 250 is turned off. If the filter 242 is not to be included in the circuit, switches 246 and 248 are turned off and analog switch 250 is turned on.

All signals up to the input of the A/D converter are of analog voltage levels. The A/D converter serves to convert the analog voltage at its input to a multibit digital value at its output. As appreciated by those of ordinary skill in the art, The A/D converter may have different resolutions and conversion times. A preferred embodiment contains 12-bits of resolution.

The digital output lines 252 from the A/D converter (n lines are shown) may be connected to digital logic modules in the user-programmable digital logic module array portion of the integrated circuit as shown in FIG. 4. The digital lines 252 are brought into a channel of interconnect conductors 254 where they intersect individual conductors 256, 258, 260, 262, 264, and 266. Programmable interconnect elements 268 may be located at each intersection. These interconnect elements 268 may be programmed to connect the digital output lines 252 from the A/D converter to selected ones of the interconnect conductors.

Diagnostic circuitry may be included on the integrated circuit to allow observation and/or control of selected circuit nodes. The diagnostic circuitry preferred for use in the digital portion of the circuit is disclosed in U.S. Pat. No. 4,857,744 and co-pending application Ser. No. 07/646,268, filed Jan. 28, 1991, entitled Testability Circuits for Logic Circuit Arrays, both of which are expressly incorporated herein by reference.

Figure 5:
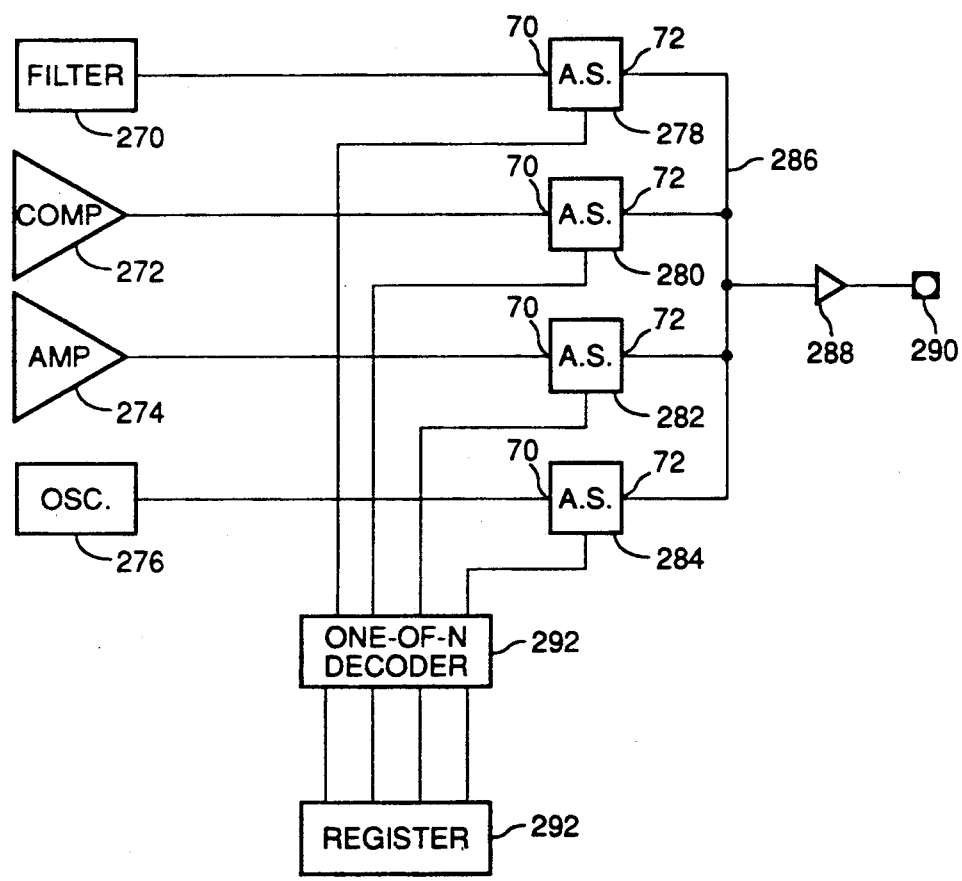
FIG. 5 is a block diagram illustrating analog probe circuitry used in a presently preferred embodiment of the invention.

Referring to FIG. 5, diagnostic circuitry for the analog portion of the array of the present invention is shown. The analog circuitry whose outputs are to be probed includes a filter 270, a comparator 272, an amplifier 274, and an oscillator 276. The outputs of filter 270, a comparator 272, an amplifier 274, and oscillator 276 are connected to the inputs of analog switches 278, 280, 282, and 284, respectively. The outputs of analog switches 278, 280, 282, and 284 are connected to a common circuit node 286. Node 286 is connected to the input of a buffer amplifier 288. The output of buffer amplifier 288 is connected to an output pad 290 of the integrated circuit containing the array of the present invention.

In a presently preferred embodiment, analog switches 278, 280, 282, and 284 may include a portion of the circuit of FIG. 2b comprising input 72, output 72, N-channel MOS transistor 80, P-channel MOS transistor 82, node 84, and inverter 86, where node 84 is the control node of the switch and turns it on when at a high voltage level and off when at ground. Reference numerals 70, 72, and 84 are used to indicate these elements in FIG. 5.

Control inputs 84 of analog switches 278, 280, 282, and 284 are connected to the outputs of one-of-N decoder 292 One-of-N decoder 292 may be one of a number of known decoder circuits and may be driven from register 294 from signals originating off chip in the manner taught by U.S. Pat. No. 4,758,745.

When one of the outputs of one-of-n decoder 292 turns on the analog switch with which it is associated, the analog voltage value at the output of the selected analog function circuit becomes available on output pad 290.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. An user-configurable integrated circuit architecture, including:
   a plurality of user-configurable digital logic circuit modules, each of said digital logic module having a plurality of inputs and at least one output, at least one of said digital logic circuit modules including means for configuring said digital logic module by a user to perform one of a plurality of functions;
   a plurality of user-configurable analog circuit modules, each of said analog circuit modules having an input and an output, at least one of said analog circuit modules including programmable means, programmable by a user, for selecting one or more circuit parameters for said at least one of said analog circuit modules;
   a first group of input/output pads on said integrated circuit, each one of said first group of input output pads communicating with the input of one of said analog circuit modules;
   a second group of input/output pads on said integrated circuit, each one of said second group of input/output pads communicating with the output of one of said analog circuit modules;
   at least one analog-to-digital converter having an analog input and a multibit digital output;
   at least one digital-to-analog converter having a multibit digital input and an analog output;
   a plurality of user configurable analog switches, first ones of said plurality of analog switches connected between ones of said input/output pads in said first group and the inputs of selected ones of said analog circuit modules, second ones of said analog switches connected between ones of said input/output pads in said second group and the outputs of selected ones of said analog circuit modules, second ones of said analog switches, third ones of said analog switches connected between the outputs of ones of said analog circuit modules and the analog input of said at least one analog-to-digital converter, fourth ones of said analog switches connected between the analog output of said at least one analog-to-digital converter and selected ones of said analog circuit modules and said input/output pads of said second group;
   a plurality of interconnect conductors associated with said plurality of digital logic circuit modules, the multibit digital output of said at least one analog-to-digital converter and the multibit digital input of said at least one digital-to-analog converter, each of said interconnect conductors divided into one or more segments, at least some first ones of said segments running in a first direction and at least some second ones of said segments running in a second direction different from said first direction so as to form intersections between said first ones and second ones of said segments;
   a plurality of user programmable interconnect elements, first ones of said interconnect elements connected between adjoining ones of said segments in a same one of said interconnect conductors, second ones of said interconnect elements connected between intersections of selected ones of said first and second segments, third ones of said interconnect elements connected between inputs and outputs of said digital logic modules and selected ones of said segments, fourth ones of said interconnect elements connected between the multibit digital output of said at least one analog-to-digital converter and the multibit digital input of said at least one digital-to-analog converter and selected ones of said segments.

2. An user-configurable integrated circuit architecture, including:
   a plurality of user-configurable digital logic circuit modules, each of said digital logic module having a plurality of inputs and at least one output, at least one of said digital logic circuit modules including means for configuring said digital logic module by a user to perform one of a plurality of functions;
   a plurality of user-configurable analog circuit modules, each of said analog circuit modules having an input and an output, at least one of said analog circuit modules including programmable means, programmable by a user, for selecting one or more circuit parameters for said at least one of said analog circuit modules;
   a plurality of analog input buffers, each one of said analog input buffers having an input and an output;
   a plurality of analog output buffers, each one of said analog output buffers having an input and an output;
   a first group of input/output pads on said integrated circuit, each one of said first group of input output pads communicating with the input of one of said input buffers;
   a second group of input/output pads on said integrated circuit, each one of said second group of input/output pads communicating with the output of one of said output buffers;
   at least one analog-to-digital converter having an analog input and a multibit digital output;
   at least one digital-to-analog converter having a multibit digital input and an analog output;
   a plurality of user configurable analog switches, first ones of said plurality of analog switches connected between ones of said input/output pads in said first group and the inputs of selected ones of said analog circuit modules, second ones of said analog switches connected between ones of said input-/output pads in said second group and the outputs of selected ones of said analog circuit modules, second ones of said analog switches, third ones of said analog switches connected between the outputs of ones of said analog circuit modules and the analog input of said at least one analog-to-digital converter, fourth ones of said analog switches connected between the analog output of said at least one analog-to-digital converter and selected ones of said analog circuit modules and said input/output pads of said second group;

a plurality of interconnect conductors associated with said plurality of digital logic circuit modules, the multibit digital output of said at least one analog-to-digital converter and the multibit digital input of said at least one digital-to-analog converter, each of said interconnect conductors divided into one or more segments, at least some first ones of said segments running in a first direction and at least some second ones of said segments running in a second direction different from said first direction so as to form intersections between said first ones and second ones of said segments;

a plurality of user programmable interconnect elements, first ones of said interconnect elements connected between adjoining ones of said segments in a same one of said interconnect conductors, second ones of said interconnect elements connected between intersections of selected ones of said first and second segments, third ones of said interconnect elements connected between inputs and outputs of said digital logic modules and selected ones of said segments, fourth ones of said interconnect elements connected between the multibit digital output of said at least one analog-to-digital converter and the multibit digital input of said at least one digital-to-analog converter and selected ones of said segments.

* * * * *